United States Patent
Lei

(10) Patent No.: US 10,203,898 B2
(45) Date of Patent: Feb. 12, 2019

(54) DEVICE AND METHOD OF MEDIAN FILTERING

(71) Applicants: SHANGHAI IC R&D CENTER CO., LTD., Shanghai (CN); CHENGDU IMAGE DESIGN TECHNOLOGY CO., LTD., Chengdu (CN)

(72) Inventor: Dongmei Lei, Shanghai (CN)

(73) Assignees: SHANGHAI IC R&D CENTER CO., LTD, Shanghai (CN); CHENGDU IMAGE DESIGN TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 15/531,415

(22) PCT Filed: Nov. 30, 2015

(86) PCT No.: PCT/CN2015/000827
§ 371 (c)(1),
(2) Date: May 26, 2017

(87) PCT Pub. No.: WO2016/082306
PCT Pub. Date: Jun. 2, 2016

(65) Prior Publication Data
US 2017/0315748 A1    Nov. 2, 2017

(30) Foreign Application Priority Data
Nov. 28, 2014    (CN) .......................... 2014 1 0708613

(51) Int. Cl.
*G06F 17/10*    (2006.01)
*G06F 3/06*    (2006.01)
(Continued)

(52) U.S. Cl.
CPC .......... *G06F 3/0638* (2013.01); *G06F 3/0604* (2013.01); *G06F 3/0656* (2013.01);
(Continued)

(58) Field of Classification Search
None
See application file for complete search history.

(56) References Cited

U.S. PATENT DOCUMENTS 4,928,258 A * 5/1990 May .................... H03H 17/0263
708/304
6,687,413 B2 * 2/2004 Yushiya .................... G06T 5/20
348/E5.004

(Continued)

*Primary Examiner* — David H Malzahn
(74) *Attorney, Agent, or Firm* — Tianchen LLC.

(57) ABSTRACT

A median filter device is provided with a reordered circuit, a comparison circuit and a data refresh circuit on the basis of the conventional data buffer circuit and data register circuit. The reorder circuit re-sorts the signal data stored in the data buffer circuit in a preceding clock cycle according to their numerical values. The comparison circuit compares the new signal datum entered in the current clock cycle with the signal data already stored to generate a median. The data refresh circuit updates the signal codes stored in the data register circuit with the signal codes corresponding to the new signal data, for calculation of the median in a following clock cycle. The length of the data buffer circuit and data register circuit can be reduced from N signal data to N−1 signal data, which achieves less data storage capacity, smaller circuit area, easier data processing and higher operation efficiency.

10 Claims, 3 Drawing Sheets

(51) Int. Cl.
*H03H 17/02* (2006.01)
*H04N 19/42* (2014.01)
*H04N 19/80* (2014.01)

(52) U.S. Cl.
CPC .......... *G06F 3/0673* (2013.01); *H03H 17/02* (2013.01); *H03H 17/0263* (2013.01); *H04N 19/42* (2014.11); *H04N 19/80* (2014.11)

(56) References Cited

U.S. PATENT DOCUMENTS

| | | | | |
|---|---|---|---|---|
| 7,003,535 B1* | 2/2006 | Kelley | ...................... | G06T 1/20 |
| | | | | 708/202 |
| 2003/0200242 A1* | 10/2003 | Jensen | ................... | A61N 1/025 |
| | | | | 708/304 |
| 2008/0079483 A1* | 4/2008 | Ono | ........................ | G06F 7/026 |
| | | | | 327/551 |
| 2011/0099215 A1* | 4/2011 | Bhattacharjee | ........... | G06F 7/22 |
| | | | | 708/202 |
| 2017/0315748 A1* | 11/2017 | Lei | ........................ | H03H 17/02 |
| 2018/0181539 A1* | 6/2018 | Lee | ........................ | G06F 17/10 |

\* cited by examiner

DEVICE AND METHOD OF MEDIAN FILTERING

CROSS-REFERENCE TO RELATED APPLICATION

This application claims the priority benefit of International Patent Application Serial No. PCT/CN2015/000827, filed Nov. 30, 2015, which is related to and claims the priority benefit of China patent application serial No. 201410708613.0, filed Nov. 28, 2014. The entirety of each of the above-mentioned patent applications is hereby incorporated by reference herein and made a part of this specification.

FIELD OF THE INVENTION

The present invention generally relates to the field of median filtering technology, and more particularly, to a device and method of median filtering.

BACKGROUND OF THE INVENTION

As well known, it usually requires extraction of faint target image signal from a complicated image background in image processing. Because of the signal-to-noise ratio of the target image signal is low, filtering pretreatments are performed to effectively reduce the background noise or the random noise to improve the quality of the target image signal. For example, in an ultrasonic imaging system, when measuring the blood flow velocity of a heart, an artery or a vein using the spectral doppler technology, the random noise or the extreme noise may be introduced into the blood flow image. In order to eliminate or reduce such noise, filtering is applied to the image signal, so that the quality of the blood flow image can be improved and the accuracy of the ultrasonic measurement can be enhanced. Different filtering methods like longitudinal filtering, transverse filtering, median filtering, spatial smooth filtering can be taken based on the system complicity and available resources. Among these filtering methods, the median filtering has been extensively applied as it can effectively eliminate the random, spike-like speckle noise.

The median filtering is a non-linear filtering technology, which is commonly used in image processing for removing noises in image signal or other signals. The main idea of the median filtering is to check samples from the input signal, which is performed by a "window" formed by N samples (N is an odd number). The samples in the window are ranked and the middle value (the median) becomes the output. Then, the window removes a first entered sample and introduces a new sample, and repeats the above-mentioned calculation process.

The conventional median filter generally has the following two structures:

The median filter of a first type comprises a data buffer with a length of N signal data and a data register with a length of N signal data. In each clock cycle, N signal data are stored in the data buffer based on the principles of FIFO, while sorted in the data register according to their numerical values. For example, the N signal data are encoded into N decimal values from 0 to N−1 according to their numerical values and the N decimal values are stored in the data register from large to small or small to large, wherein 0 represents the signal datum with the minimum numerical value, N−1 represents the signal datum with the maximum numerical value. In a current clock cycle, when a new signal datum enters the data buffer and a first signal datum entered in a preceding clock cycle leaves the data buffer, the data register re-sorted the latest N signal data and then updates the decimal values stored therein. The median is the numerical value of the signal datum ranked at (N−1)/2+1 in the data register.

The median filter of a second type comprises a data buffer with a length of N signal data and a data register with a length of N signal data. The N signal data are sorted in the data buffer according to their numerical values, while sorted in the data register according to their entry sequence. In a current clock cycle, when a new signal datum enters the data buffer and a first signal datum entered in a preceding clock cycle leaves the data buffer, the latest N signal data are re-sorted according to their numerical values, and the sequence of the latest N signal data is updated.

However, either of the median filters mentioned above is provided with a data buffer and a data register each with a length of N signal data, which requires big data storage capacity, complicated processing ability and large median filtering circuit area, and finally affects the operation efficiency of the median filter.

BRIEF SUMMARY OF THE DISCLOSURE

Accordingly, an objective of the present invention is to provide a device and method of median filtering, which can effectively reduce the length of the data memory from N signal data to N−1 signal data, so as to achieve a smaller circuit area, easier data processing and higher operation efficiency.

To achieve the above objective, the present invention provides a median filter device to obtain a middle value of N signal data stored therein in each clock cycle, wherein N is an odd number greater than 1. The median filter device comprises:

a data buffer circuit with a length of N−1 signal data, for storing last N−1 signal data of a sequence of signal data sequentially entering the median filter device during a preceding clock cycle;

a data register circuit with a length of N−1 signal data, for encoding the signal data stored in the data buffer circuit into signal codes according to numerical values of the signal data;

a reorder circuit connected with the data buffer circuit and the data register circuit, for sorting all the signal data stored in the data buffer circuit according to their corresponding signal codes from small to large or large to small to obtain a sequence of reordered signal data;

a comparison circuit connected with the reorder circuit, for comparing a new signal datum entering the median filter device in the current clock cycle with the N−1 signal data in the sequence of the reordered signal data, and inserting the new signal datum into the sequence of the reordered signal data according to the numerical value of the new signal datum to form a new signal data sequence of N signal data from large to small or small to large stored in the median filter device in the current clock cycle, and generating a median of the N signal data stored in the median filter device in the current clock cycle; and a data refresh circuit connected with the comparison circuit and the data register circuit, for encoding rest N−1 signal data except for a signal datum to leave the median filter device in the current clock cycle into new signal codes according to their numerical values, and updating the signal codes stored in the data register circuit with the new signal codes according to the entry sequence of the rest N−1 signal data.

In the present invention, "N" represents for the number of signal data, each signal datum is stored in a unit memory element. Accordingly, a memory with a length of N−1 signal data, as the data buffer circuit and the data register circuit, is a memory which has N−1 unit memory elements.

Furthermore, the comparison circuit also performs positional encoding to each position adjacent to each of the reordered N−1 signal data into a positional code. Wherein two positions adjacent to the signal datum to leave the median filter device are encoded to have a same positional code, such that N−1 positional codes of positions where the new signal datum can be inserted are obtained. The comparison circuit compares the new signal datum entering the median filter device with the N−1 signal data of the sequence of the reordered signal data, and inserts the new signal datum into a corresponding position in the sequence, so as to form a new signal data sequence of N signal data from large to small or small to large. The comparison circuit further takes the numerical value of a signal datum ranked at (N−1)/2+1 in the new signal data sequence as the median.

Furthermore, the data buffer circuit removes the signal datum to leave in the current clock cycle and adds the new entered signal datum in the current clock cycle, and stores N−1 signal data for the following clock cycle.

Furthermore, the data register circuit encodes the signal data using binary code, decimal code, or hexadecimal code.

Furthermore, the comparison circuit encodes the positions of the signal data using binary code.

The present invention further provides a median filter method using the above median filter device to obtain a middle value of N signal data stored therein in each clock cycle, wherein N is an odd number greater than 1. The median filter method comprises the following steps:

S01, in a preceding clock cycle, storing last N−1 signal data of a sequence of signal data sequentially received by the median filter device during a preceding clock cycle through the data buffer circuit; encoding the signal data stored in the data buffer circuit into encoded data through the data register circuit according to numerical values of the signal data; sorting all the signal data stored in the data buffer circuit according to their corresponding encoded data from small to large or from large to small by the reorder circuit to obtain a sequence of reordered signal data;

S02, in the current clock cycle, receiving a new signal datum by the median filter device;

S03, comparing the new signal datum with the N−1 signal data in the sequence of the reordered signal data, inserting the new signal datum into the sequence of the reordered signal data according to the numerical value of the new signal datum to form a new signal data sequence of N signal data from large to small or small to large stored in the median filter device in the current clock cycle, and generating a median of the N signal data stored in the median filter device in the current clock cycle, by the comparison circuit;

S04, encoding rest N−1 signal data except for a signal datum to leave the median filter device in the current clock cycle into new signal codes according to their numerical values, and updating the signal codes stored in the data register circuit with the new signal codes according to the entry sequence of the rest N−1 signal data, by the data refresh circuit.

S05, removing the signal to leave the median filter device.

Furthermore, step S03 further comprises: performing positional encoding to each position adjacent to each of the reordered N−1 signal data into a positional code. Wherein two positions adjacent to the signal datum to leave the median filter device are encoded to have a same positional code, such that N−1 positional codes of positions where the new signal datum can be inserted are obtained. Then, the new signal datum entering the median filter device is compared with the N−1 signal data of the sequence of the reordered signal data, and is inserted into a corresponding position in the sequence, thereby forming a new signal data sequence of N signal data from large to small or small to large. The numerical value of the signal datum ranked at (N−1)/2+1 in the new signal data sequence is the median.

Furthermore, step S05 further comprises removing the signal datum to leave the median filter device in the current clock cycle from the data buffer circuit and adding the new entered signal datum in the current clock cycle into the data buffer circuit, and storing N−1 signal data for a following clock cycle in the data buffer circuit.

Furthermore, the data register circuit encodes the signal data using binary code, decimal code or hexadecimal code.

Furthermore, the comparison circuit encodes the positions of the signal data using binary code.

According to the median filter device and method of the present invention, a reordered circuit, a comparison circuit and a data refresh circuit are provided on the basis of the conventional data buffer circuit and data register circuit. The reorder circuit re-sorts the signal data stored in the data buffer circuit in a preceding clock cycle according to their numerical values. The comparison circuit compares the new signal datum entered in the current clock cycle with the signal data already stored to generate a median. The data refresh circuit updates the signal codes stored in the data register circuit with the signal codes corresponding to the new sequence of signal data, for calculation of the median in a following clock cycle. From above, the length of the data buffer circuit and data register circuit can be reduced from N signal data to N−1 signal data, which achieves less data storage capacity, smaller circuit area, easier data processing and higher operation efficiency. In addition, for a median filter device in which $N=2^M+1$, since only N−1 signal data are positional encoded, and preferably two positions adjacent to the signal datum to be removed are encoded with a same positional code, the positional encode bit wide can be reduced from M+1 bits to M bits.

DETAILED DESCRIPTION OF THE EMBODIMENTS

The embodiments of the present invention will now be descried more fully hereinafter with reference to the accompanying drawings. It should be appreciated that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims. The figures are not necessarily drawn to scale, should be understood to provide a representation of particular embodiments of the invention, and are merely conceptual in nature and illustrative of the principles involved.

Figure 1:
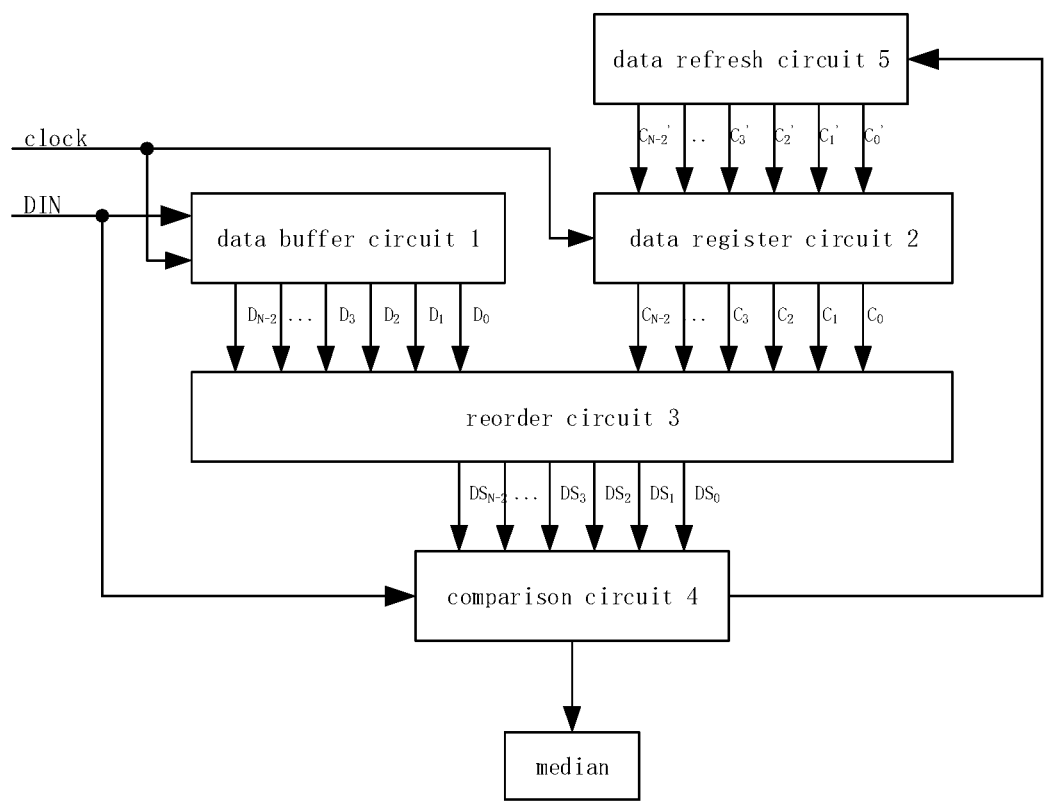
FIG. 1 is a circuit diagram of the median filter device of the present invention.

Please refer to FIG. 1, in the present invention, the median filter device to obtain a median of N signal data stored in it in each clock cycle comprises a data buffer circuit, a data register circuit, a reorder circuit, a comparison circuit and a data refresh circuit.

The data buffer circuit 1 has a length of N−1 signal data, meaning a storage capacity of N−1 signal data, to store a sequence of last N−1 signal data sequentially received by the median filter device in a preceding clock cycle, represented by $D_{N-2}, D_{N-3}, \ldots, D_2, D_1, D_0$. Wherein, $D_0$ is the first signal data in the data buffer circuit, $D_{N-2}$ is the last signal data in the data buffer circuit.

The data register circuit 2 has a length of N−1 signal data, meaning a storage capacity of N−1 signal data, to store signal codes corresponding to numerical values of the signal data in the data buffer circuit in the same sequence as the entry sequence of these signal data, represented by $C_{N-2}, C_{N-3}, \ldots, C_2, C_1, C_0$ herein. Wherein, $C_{N-2}, C_{N-3}, \ldots, C_2, C_1, C_0$ are signal codes corresponding to the signal data $D_{N-2}, D_{N-3}, \ldots, D_2, D_1, D_0$ stored in the data buffer circuit.

The term "signal code" is a code which reflects the numerical value of each signal data. For example, the signal codes can be decimal codes like 0, 1, 2, . . . N−1. In practical application, the signal codes also be binary codes or hexadecimal codes.

The reorder circuit 3 is respectively connected with the data buffer circuit 1 and the data register circuit 2, for sorting all the signal data stored in the data buffer circuit 1 from small to large or large to small according to their corresponding signal codes in the data register circuit 2, so as to obtain a sequence of reordered signal data, represented by $DS_{N-2}, DS_{N-3}, \ldots, DS_2, DS_1, DS_0$; wherein $DS_{N-2} \geq DS_{N-3} \geq \ldots \geq DS_2 \geq DS_1 \geq DS_0$.

The comparison circuit 4 is connected with the reorder circuit 3, for comparing a new signal datum DIN entering the median filter device in the current clock cycle with the reordered signal data, forming a new signal data sequence of N signal data and generating a median of the N signal data in the current clock cycle.

The data refresh circuit 5 is respectively connected with the comparison circuit 4 and the data register circuit 2, for encoding rest N−1 signal data except for the signal datum $D_0$ to leave the median filter device in the current clock cycle into new signal codes according to their numerical values, and updating the signal codes stored in the data register circuit 2 with the new signal codes in the same sequence as the entry sequence of the rest N−1 signal data, so as to obtain N−1 new signal codes $C'_{N-2}, C'_{N-3}, \ldots, C'_2, C'_1, C'_0$ corresponding to the numerical values of the signal data DIN, $D_{N-2}, D_{N-3}, \ldots, D_2, D_1$. Wherein, N is an odd number greater than 1.

Figure 2:
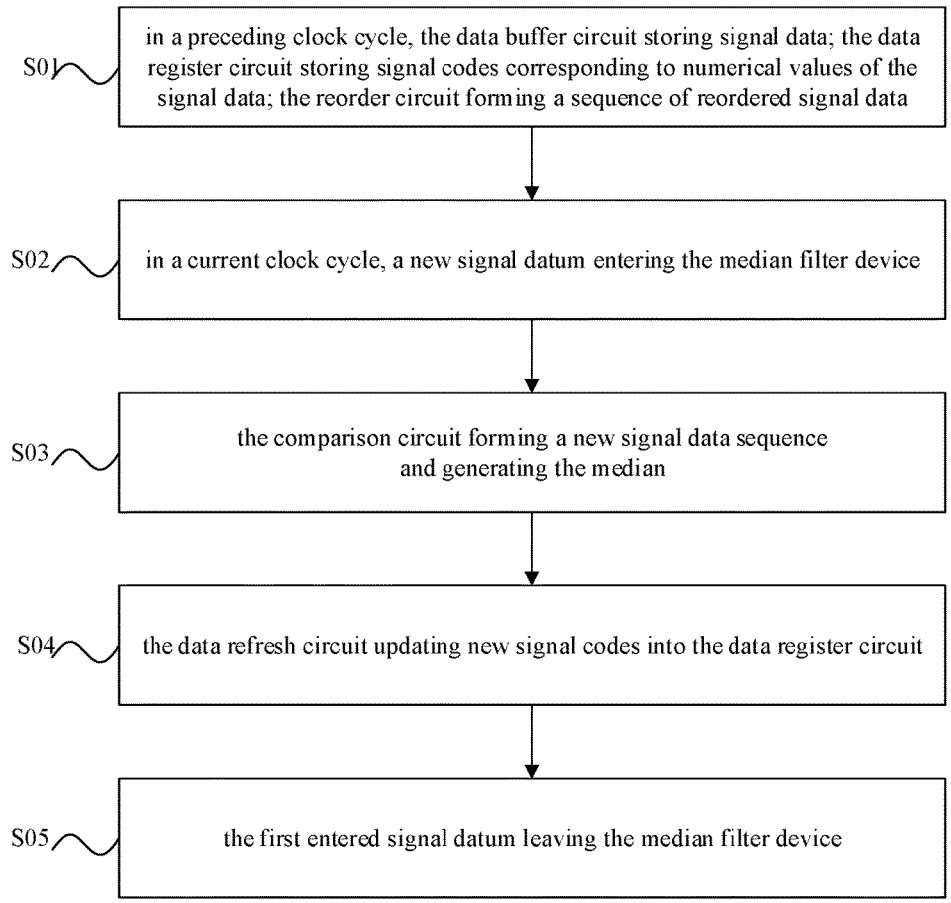
FIG. 2 is a flow chart of the median filter method of the present invention.

Please refer to FIG. 2, the median filter method using the above median filter device to obtain a middle value of N signal data stored therein in each clock cycle comprises the following steps:

S01, in a preceding clock cycle, the data buffer circuit storing last N−1 signal data of a sequence of signal data sequentially received by the median filter device; the data register circuit storing N−1 signal codes corresponding to numerical values of the signal data in the data buffer circuit in the same sequence as the entry sequence of these signal data; the reorder circuit sorting all the signal data stored in the data buffer circuit 1 from small to large or large to small according to their corresponding signal codes, so as to obtain a sequence of reordered signal data;

S02, in a current clock cycle, a new signal datum entering the median filter device;

S03, the comparison circuit comparing the new signal datum with the N−1 reordered signal data, forming a new signal data sequence of N signal data in the current clock cycle, and generating a median of the N signal data;

S04, the data refresh circuit encoding rest N−1 signal data except for a signal datum to leave the median filter device (the first signal data entering the median filter device in the current clock cycle) in the current clock cycle into new signal codes according to their numerical values, and updating the signal codes stored in the data register circuit with the new signal codes in the same sequence with the entry sequence of the rest N−1 signal data.

S05, the first entered signal datum leaving the median filter device.

Figure 3:
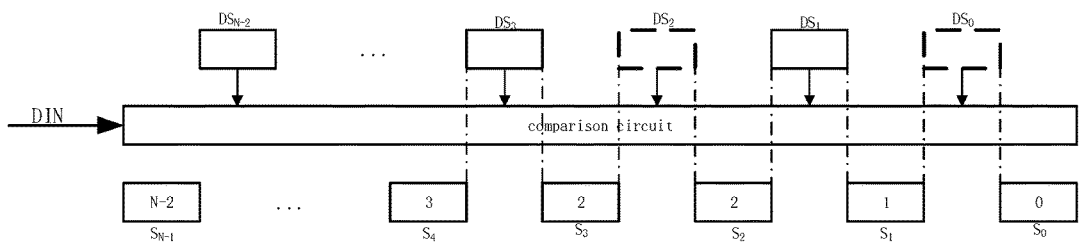
FIG. 3 is a diagram showing the comparison circuit processing the new signal datum.

Wherein, step S03 is preferably implemented in the following way:

The comparison circuit performs positional encoding to each position adjacent to each of the reordered N−1 signal data into a positional code. Wherein two positions adjacent to the signal datum to leave the median filter device are encoded to have a same positional code, such that N−1 positional codes of positions where the new signal datum can be inserted are obtained. Then, the comparison circuit compares the new signal datum entering the median filter device with the N−1 reordered signal data, and inserts the new signal datum into the reordered signal data to form a new signal data sequence of N signal data and generates the median of the N signal data. Specifically, as shown in FIG. 3, in the sequence of reordered signal data $DS_{N-2}, DS_{N-3}, \ldots, DS_2, DS_1, DS_0$, the positions between each two adjacent reordered signal data and the positions at two ends of the sequence of the reordered signal data are all positional encoded. These positions can be inserted by the new signal datum. Assuming that the signal datum to leave is $DS_2$, two positions adjacent to signal datum $DS_2$ are encoded to have a same positional code, and all the positional codes are represented as $S_{N-1}, S_{N-2}, \ldots, S_2, S_1, S_0$. Wherein, $S_{N-1}$ represents a position where the new signal datum DIN is inserted before the signal data $DS_{N-2}$ (DIN≥DSN−2), $S_4$ represents a position where the new signal datum DIN is inserted between the signal data $DS_4$ and $DS_3$ ($DS_4$>DIN≥$DS_3$), $S_3$ represents a position where the new signal datum DIN is inserted between the signal data $DS_3$ and $DS_4$ ($DS_3$>DIN≥$DS_2$), $S_2$ represents a position where the new signal datum DIN is inserted between the signal data $DS_2$ and $DS_1$ ($DS_2$>DIN≥$DS_1$), $S_1$ represents a position where the new signal datum DIN is inserted between the signal data $DS_1$ and $DS_0$ ($DS_1$>DIN≥$DS_0$), and $S_0$ represents a position where the new signal datum DIN is inserted after the signal data $DS_0$ ($DS_0$>DIN). In the embodiment, the value of the positional codes are N−2 . . . 3, 2, 1, 0. Therefore, for the insertion of the new signal datum, only N−1 positional codes are required. Then, the comparison circuit compares the new signal datum with the N−1 reordered signal data, and inserts the new signal datum to form a new signal data sequence of N signal data including the signal datum to leave. The numerical value of the signal datum ranked at (N−1)/2+1 in the new signal data sequence is the median. Furthermore, step S050 further comprises removes the first entered signal datum from the data buffer circuit and adds the new signal datum into the data buffer circuit.

Wherein, N is an odd number.

The data process in a clock cycle and a following clock cycle will be described with reference to FIG. 4 and FIG. 5 as follows. Wherein, N equals to 5.

Figure 4:
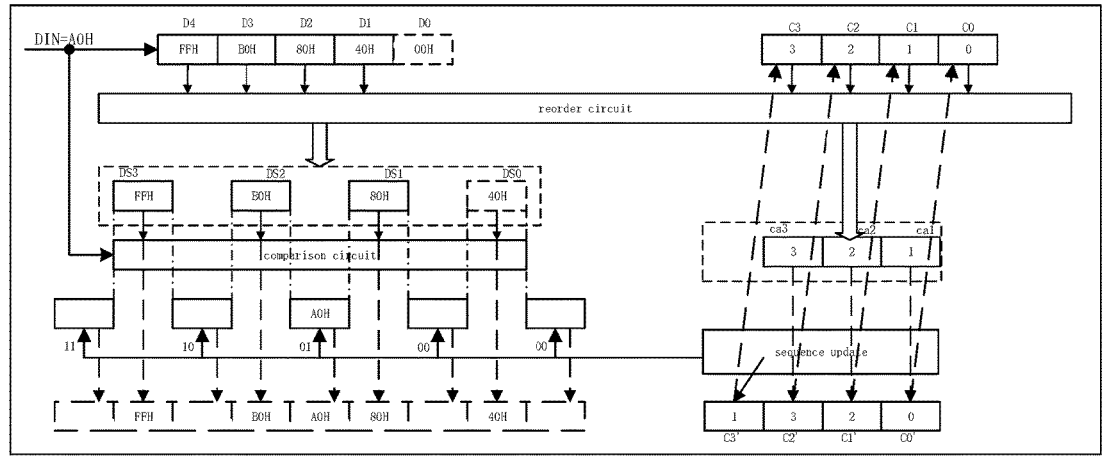
FIG. 4 is a diagram showing signal data process in a clock cycle according to a first embodiment of the present invention.

As shown in FIG. 4, in a current clock cycle, the data buffer circuit has already stored four signal data "FFH", "B0H", "80H", "40H" in the order of entry sequence. Wherein, the signal data "00H" is removed from the data buffer circuit before the current clock cycle. The data register circuit encodes these four signal data into signal codes "3", "2", "1", "0" corresponding to the numerical values of the signal data and stored therein. The reorder circuit re-sorted these four signal data from large to small to form a new sequence of reordered signal data "FFH", "B0H", "80H", "40H".

In the current clock cycle, a new signal datum A0H enters the median filter device. The comparison circuit encodes the positions adjacent to the signal data 40H which will leave the median filter device into a same binary code "00", and encodes the other positions adjacent to the other signal data in the new sequence from large to small into binary codes "11", "10" and "01". The comparison circuit compares the signal datum "A0H" with the four signal data and determines that the signal datum "A0H" should be inserted into the position with a positional code of "01". As a result, the new sequence of signal data is formed as "FFH", "B0H", "A0H", "80H", "40H". The median is generated to be A0H.

The data refresh circuit encodes rest four signal data "FFH", "B0H", "A0H", "80H", except for the signal datum "40H" to leave the median filter device, into four new signal codes corresponding to their numerical values, and updates the signal codes stored in data register circuit with the new signal codes "1", "3", "2", "0" in the same sequence as the entry sequence of the four signal data.

Finally, the first entered signal data in the current clock cycle "40H" leaves the median filter device as well as the data buffer circuit.

Figure 5:
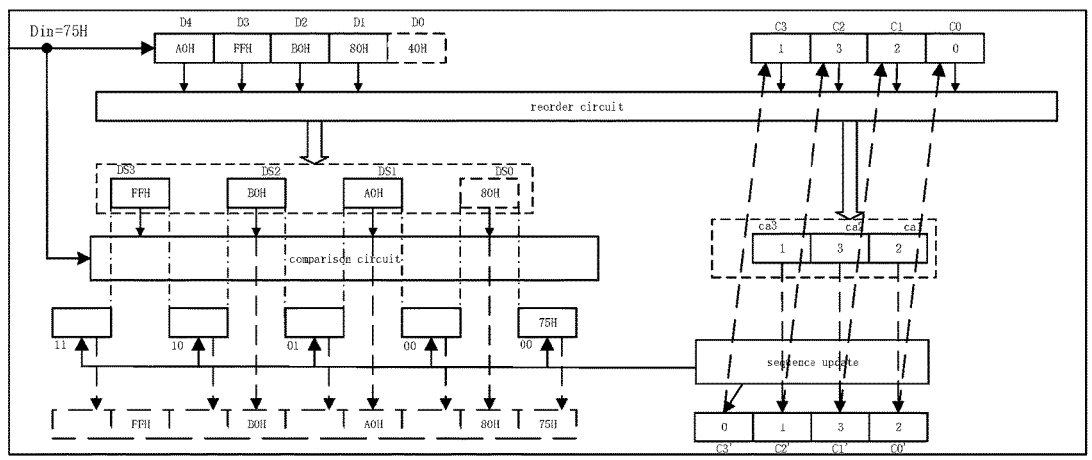
FIG. 5 is a diagram showing signal data process in a following clock cycle according to the first embodiment of the present invention.

As shown in FIG. 5, in a following clock cycle, the signal datum "80H" is the signal datum to leave while the signal datum "75H" is the new entered signal data. Similarly, the data buffer circuit stores the signal data "A0H", "FFH", "B0H", "80H" sequentially, and the data register circuit encodes these signal data sequentially into signal codes "1", "3", "2", "0".

When the new signal datum "75H" enters the median filter device, the comparison circuit compares the numerical value of it with that of the other four signal data, and inserts the signal data "75H" into the position with a positional code "00". The new sequence of five signal data is formed as "FFH", "B0H", "A0H", "80H", "75H". The median is generated to be A0H.

When the signal data "80H" leaves, the data refresh circuit updates the data register circuit with the signal codes "0", "1", "3", "2" corresponding to the rest four signal data in the same sequence as the entry sequence of the rest four signal data.

Finally, the signal data "80H" leaves the median filter device.

While this invention has been particularly shown and described with references to preferred embodiments thereof. This invention may, however, be embodied in different forms and should not be construed as limited to the embodiments set forth herein. It will be understood by those skilled in the art that various changes in form and details may be made herein without departing from the spirit and scope of the invention as defined by the appended claims.

The invention claimed is:

1. A median filter device to obtain a middle value of N signal data stored therein in each clock cycle, wherein N is an odd number greater than 1; the median filter device comprises:

a data buffer circuit with a length of N−1 signal data, for storing last N−1 signal data of a sequence of signal data sequentially received by the median filter device during a preceding clock cycle, wherein each signal data has a numerical value;

a data encoding circuit with a length of N−1 signal data, for encoding the signal data stored in the data buffer circuit into signal codes according to the numerical values of the signal data;

a reorder circuit connected with the data buffer circuit and the data encoding circuit, for sorting all the signal data stored in the data buffer circuit according to their corresponding signal codes from small to large or large to small to obtain a sequence of reordered signal data;

a comparison circuit connected with the reorder circuit, for comparing a new signal datum entering the median filter device in the current clock cycle with the N−1 signal data in the sequence of the reordered signal data, and inserting the new signal datum into the sequence of the reordered signal data according to the numerical value of the new signal datum to form a new signal data sequence of N signal data stored in the median filter device in the current clock cycle from large to small or small to large, and generating a median of the N signal data stored in the median filter device in the current clock cycle; and a data refresh circuit connected with the comparison circuit and the data encoding circuit, for encoding rest N−1 signal data except for signal data to leave the median filter device in the current clock cycle into new signal codes according to their numerical values, and updating the signal codes stored in the data encoding circuit with the new signal codes according to the entry sequence of the rest N−1 signal data.

2. The median filter device according to claim 1, wherein the comparison circuit further performs positional encoding to each position adjacent to each of the reordered N−1 signal data into a positional code to obtain N−1 positional codes of positions where the new signal datum to be inserted, wherein two positions adjacent to the signal datum to leave the median filter device are encoded to have a same positional code; the comparison circuit compares the new signal datum with the N−1 signal data of the sequence of the reordered signal data, and inserts the new signal datum into a corresponding position in the sequence, so as to form a new signal data sequence of N signal data from large to small or small to large; the comparison circuit further takes the numerical value of a signal datum ranked at (N−1)/2+1 in the new signal data sequence as the median.

3. The median filter device according to claim 2, wherein the comparison circuit encodes the positions of the signal data based on binary format.

4. The median filter device according to claim 1, wherein the data buffer circuit removes the signal datum to leave in the current clock cycle and adds the new entered signal datum in the current clock cycle, and stores N−1 signal data for a following clock cycle.

5. The median filter device according to claim 1, wherein the data encoding circuit encodes the signal data based on binary format, decimal format, or hexadecimal format.

6. A median filter method using a median filter device according to claim 1 to obtain a middle value of N signal data stored therein in each clock cycle, wherein N is an odd number greater than 1; the median filter method comprises the following steps:
- S01, in a preceding clock cycle, storing last N−1 signal data of a sequence of signal data sequentially entering the median filter device by the data buffer circuit; encoding the signal data stored in the data buffer circuit into signal codes by the data encoding circuit according to numerical values of the signal data; sorting all the signal data stored in the data buffer circuit according to their corresponding signal codes from small to large or large to small by the reorder circuit to obtain a sequence of reordered signal data;
- S02, in a current clock cycle, receiving a new signal datum by the median filter device;
- S03, comparing the new signal datum with the N−1 signal data in the sequence of the reordered signal data, inserting the new signal datum into the sequence of the reordered signal data according to the numerical value of the new signal datum to form a new signal data sequence of N signal data from large to small or small to large stored in the median filter device in the current clock cycle, and generating a median of the N signal data stored in the median filter device in the current clock cycle, by the comparison circuit;
- S04, encoding rest N−1 signal data except for a signal datum to leave the median filter device in the current clock cycle into new signal codes according to their numerical values, and updating the signal codes stored in the data encoding circuit with the new signal codes according to the entry sequence of the rest N−1 signal data, by the data refresh circuit;
- S05, removing the signal to leave the median filter device.

7. The median filter method according to claim 6, wherein, step S03 further comprises: performing positional encoding to each position adjacent to each of the reordered N−1 signal data into a positional code to obtain N−1 positional codes of positions where the new signal datum to be inserted, wherein two positions adjacent to the signal datum to leave the median filter device are encoded to have a same positional code;
- comparing the new signal datum with the N−1 signal data of the sequence of the reordered signal data, and inserting the new signal datum into a corresponding position in the sequence, so as to form a new signal data sequence of N signal data from large to small or small to large;
- taking the numerical value of a signal datum ranked at (N−1)/2+1 in the new signal data sequence as the median.

8. The median filter method according to claim 6, wherein, step S05 further comprises removing the signal datum to leave the median filter device in the current clock cycle from the data buffer circuit and adding the new entered signal datum in the current clock cycle into the data buffer circuit, and storing N−1 signal data for a following clock cycle in the data buffer circuit.

9. The median filter method according to claim 6, wherein the data encoding circuit encodes the signal data based on binary format, decimal format, or hexadecimal format.

10. The median filter method according to claim 7, wherein the comparison circuit encodes the positions of the signal data based on binary format.

* * * * *